US010276391B1

(12) United States Patent
Zang et al.

(10) Patent No.: US 10,276,391 B1
(45) Date of Patent: Apr. 30, 2019

(54) SELF-ALIGNED GATE CAPS WITH AN INVERTED PROFILE

(71) Applicant: GLOBALFOUNDRIES Inc., Grand Cayman (KY)

(72) Inventors: Hui Zang, Guilderland, NY (US); Ruilong Xie, Niskayuna, NY (US); Laertis Economikos, Wappingers Falls, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 16/007,127

(22) Filed: Jun. 13, 2018

(51) Int. Cl.
| H01L 21/28 | (2006.01) |
| H01L 29/423 | (2006.01) |
| H01L 21/8234 | (2006.01) |
| H01L 29/66 | (2006.01) |
| H01L 29/417 | (2006.01) |

(52) U.S. Cl.
CPC .. H01L 21/28247 (2013.01); H01L 29/42376 (2013.01); H01L 29/665 (2013.01); *H01L 21/28079* (2013.01); *H01L 21/28088* (2013.01); *H01L 21/823437* (2013.01); *H01L 29/41775* (2013.01); *H01L 29/42372* (2013.01); *H01L 29/66545* (2013.01)

(58) Field of Classification Search
CPC ......... H01L 29/42372; H01L 29/66545; H01L 21/28079; H01L 21/823437
See application file for complete search history.

(56) References Cited

U.S. PATENT DOCUMENTS

| 7,564,135 | B2 | 7/2009 | Park | |
| 8,957,465 | B2 | 2/2015 | Xie et al. | |
| 9,064,801 | B1* | 6/2015 | Horak | H01L 21/283 |
| 9,093,467 | B1* | 7/2015 | Xie | H01L 29/66545 |
| 9,508,825 | B1* | 11/2016 | Basker | H01L 29/665 |
| 9,818,651 | B2 | 11/2017 | Bouche et al. | |
| 2004/0016972 | A1 | 1/2004 | Singh et al. | |
| 2005/0153530 | A1* | 7/2005 | Ku | H01L 21/28079 |
| | | | | 438/587 |
| 2009/0152595 | A1 | 6/2009 | Kaga et al. | |
| 2013/0026637 | A1* | 1/2013 | Hou | H01L 21/28088 |
| | | | | 257/770 |
| 2013/0043592 | A1* | 2/2013 | Park | H01L 29/4966 |
| | | | | 257/754 |
| 2014/0299939 | A1* | 10/2014 | Kim | H01L 21/02697 |
| | | | | 257/369 |

(Continued)

*Primary Examiner* — George R Fourson, III
(74) *Attorney, Agent, or Firm* — Thompson Hine LLP; Francois Pagette

(57) ABSTRACT

Structures for a field-effect transistor and methods of forming a structure for field-effect transistor. A gate structure includes a work function metal layer, a first conductor layer, and a second conductor layer arranged over the work function metal layer. The second conductor layer has a sidewall and a top surface, and the first conductor layer has a first section arranged between the second conductor layer and the work function metal layer and a second section arranged adjacent to a first portion of the sidewall of the second conductor layer. A dielectric cap is arranged on the gate structure. The dielectric cap has a first section arranged over the top surface of the second conductor layer and a second section arranged adjacent to a second portion of the sidewall of the second conductor layer.

20 Claims, 7 Drawing Sheets

(56) References Cited

U.S. PATENT DOCUMENTS

| | | | | |
|---|---|---|---|---|
| 2015/0145057 A1* | 5/2015 | Fan | ............... | H01L 27/092 |
| | | | | 257/369 |
| 2015/0270373 A1* | 9/2015 | Horak | ............... | H01L 29/66545 |
| | | | | 257/401 |
| 2016/0163601 A1* | 6/2016 | Xie | ............... | H01L 21/28088 |
| | | | | 257/392 |
| 2017/0004997 A1* | 1/2017 | Lu | ............... | H01L 21/76897 |
| 2017/0092543 A1* | 3/2017 | Ok | ............... | H01L 21/823475 |
| 2017/0345912 A1* | 11/2017 | Kim | ............... | H01L 21/28088 |
| 2018/0166548 A1* | 6/2018 | Huang | ............... | H01L 29/42376 |
| 2018/0277652 A1* | 9/2018 | Park | ............... | H01L 29/66545 |
| 2018/0358452 A1* | 12/2018 | Qi | ............... | H01L 29/66666 |

\* cited by examiner

SELF-ALIGNED GATE CAPS WITH AN INVERTED PROFILE

BACKGROUND

The present invention relates to semiconductor device fabrication and integrated circuits and, more specifically, to structures for a field-effect transistor and methods of forming a structure for field-effect transistor.

Device structures for a field-effect transistor generally include a body region, a source and a drain defined in the body region, and a gate structure configured to apply a control voltage that switches carrier flow in a channel formed in the body region. When a control voltage that is greater than a designated threshold voltage is applied, carrier flow occurs in the channel between the source and drain to produce a device output current.

Contacts may provide vertical electrical connections to features of semiconductor devices, such as the gate structure and source/drain regions of a field-effect transistor. Self-aligned contacts (SAC) are formed in contact openings that are constrained during etching by the configuration of adjacent structures, e.g., sidewall spacers on adjacent gate structures, as opposed to being constrained by a patterned resist. For example, a self-aligned contact may be formed in a contact opening that is defined by selectively etching one material, e.g., silicon dioxide, of an interlayer dielectric layer relative to other materials, such as silicon nitride caps on adjacent gate structures. To avoid yield loss, the silicon nitride caps should effectively electrically isolate the metal gate of the gate structure from the self-aligned contacts. However, in conventional arrangements, the proximity of the conformal layers of the metal gate to the self-aligned contact provides a significant risk of shorting.

Improved structures for a field-effect transistor and methods of forming a structure for field-effect transistor are needed.

SUMMARY

In an embodiment of the invention, a structure is provided for a semiconductor device. The structure includes a gate structure having a work function metal layer, a first conductor layer, and a second conductor layer arranged over the work function metal layer. The second conductor layer has a sidewall and a top surface, and the first conductor layer has a first section arranged between the second conductor layer and the work function metal layer, as well as a second section arranged adjacent to a first portion of the sidewall of the second conductor layer. The structure further includes a dielectric cap on the gate structure. The dielectric cap has a first section arranged over the top surface of the second conductor layer and a second section arranged adjacent to a second portion of the sidewall of the second conductor layer.

In an embodiment of the invention, a method includes forming a work function metal layer of a gate structure in a lower portion of a trench, conformally depositing a first conductor layer over the work function metal layer and on an upper portion of the trench, and forming a second conductor layer that fills the upper portion of the trench interior of the first conductor layer. The method further includes recessing the first conductor layer relative to the second conductor layer such that a section the first conductor layer is arranged adjacent to a first portion of a sidewall of the second conductor layer and a second portion of the sidewall of the second conductor layer is exposed. After recessing the first conductor layer relative to the second conductor layer, a dielectric cap is formed that includes a first section over the top surface of the second conductor layer and a second section arranged adjacent to the second portion of the sidewall of the first conductor layer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
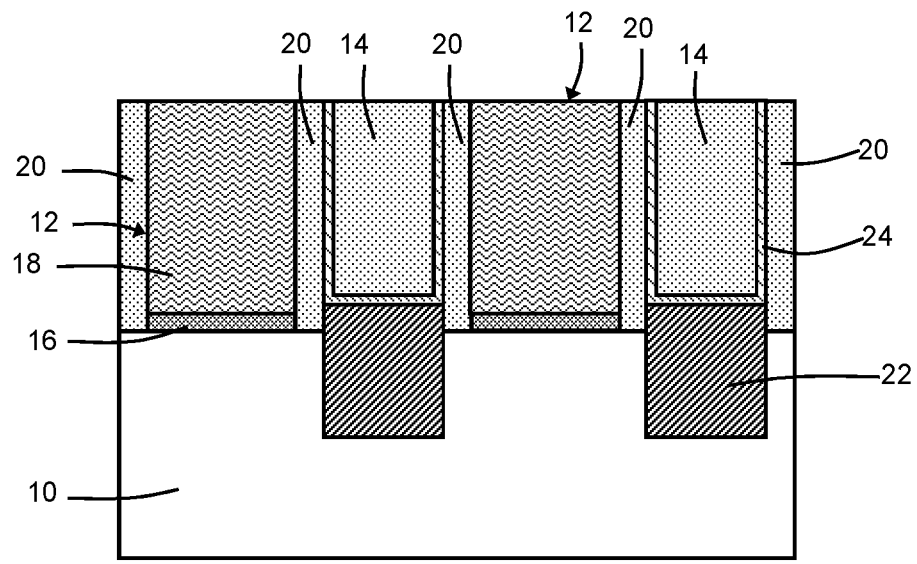
FIGS. 1-9 are cross-sectional views of a portion of a substrate at successive fabrication stages of a processing method for forming a structure in accordance with embodiments of the invention.

With reference to FIG. 1 and in accordance with embodiments of the invention, a semiconductor substrate 10 is provided that may be a bulk substrate or a device layer of a semiconductor-on-insulator (SOI) substrate. Dummy or sacrificial gate structures 12 are arranged on a top surface of the semiconductor substrate 10. Each sacrificial gate structure 12 may include an oxide layer 16 adjacent to the top surface of the semiconductor substrate 10 and a layer 18 of sacrificial material, such as amorphous silicon, which are patterned with lithography and etching such as reactive ion etching (RIE) using a patterned hardmask.

Sidewall spacers 20 are arranged at the vertical sidewalls of the sacrificial gate structures 12. The sidewall spacers 20 may be composed of a low-k dielectric material, such as silicon oxycarbonitride (SiOCN), that is deposited with atomic layer deposition (ALD) as a conformal layer on the sacrificial gate structures 12 and etched with a directional etching process, such as reactive ion etching (RIE).

Source/drain regions 22 are arranged in the gaps between the sacrificial gate structures 12. As used herein, the term "source/drain region" means a doped region of semiconductor material that can function as either a source or a drain of a field-effect transistor. The source/drain regions 22 may be formed by, for example, epitaxial growth of an in situ-doped semiconductor material, such as silicon (Si) or silicon-germanium (SiGe) from trenches formed the semiconductor substrate 10 in the gaps between the sacrificial gate structures 12. For an n-type field-effect transistor, the semiconductor material of the source/drain regions 22 may be doped with an n-type dopant from Group V of the Periodic Table (e.g., phosphorus (P) or arsenic (As)) that is effective to produce n-type conductivity. For a p-type field-effect transistor, the semiconductor material of the source/drain regions 22 may be doped with a p-type dopant selected from Group III of the Periodic Table (e.g., boron (B)) that is effective to produce p-type conductivity. The source/drain regions 22 are covered by a contact etch stop layer (CESL) 24, which may be constituted by a thin layer of silicon nitride ($Si_3N_4$).

Sections of an interlayer dielectric layer 14 are arranged to fill the gaps over the source/drain regions 22 and between the sacrificial gate structures 12. The interlayer dielectric layer 14 may be deposited over the semiconductor substrate 10 and planarized with, for example, chemical mechanical polishing (CMP). The interlayer dielectric layer 14 may be composed of a dielectric material, such as silicon dioxide ($SiO_2$). The sidewall spacers 20 are laterally arranged between the sections of the interlayer dielectric layer 14 and the sacrificial gate structures 12. The dielectric material of the interlayer dielectric layer 14 may be selected to be removable selective to the materials of the source/drain regions 22 and the sidewall spacers 20. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process.

Figure 2:
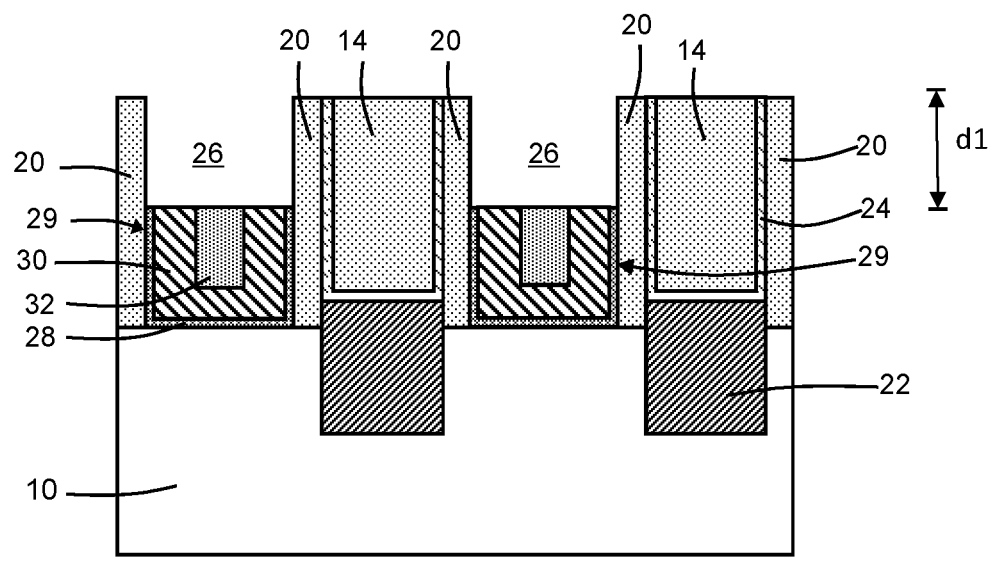

With reference to FIG. 2 in which like reference numerals refer to like features in FIG. 1 and at a subsequent fabrication stage of the processing method, the sacrificial gate structures 12 may be removed with a selective etching process. The removal of the sacrificial gate structures 12 forms trenches 26 with a depth that extends in a vertical direction to the top surface of the semiconductor substrate 10 and a width equal to the distance between the sidewall spacers 20. The dimensions of the trenches 26 are determined at least in part by the dimensions of the sacrificial gate structures 12.

Gate structure 29 are formed inside the trenches 26 that are opened by the removal of the sacrificial gate structures 12. Each gate structure 29 includes a gate dielectric layer 28 and a work function metal layer 30 that are formed as respective conformal layers inside the trenches 26. The gate dielectric layer 28, which is formed before the formation of the work function metal layer 30, conformally coats the surfaces of the semiconductor substrate 10 and sidewall spacers 20 exposed inside each trench 26. The gate dielectric layer 28 may be composed of a dielectric material, such as a high-k dielectric material like hafnium oxide ($HfO_2$) having a dielectric constant (e.g., permittivity) greater than the dielectric constant of silicon dioxide ($SiO_2$), deposited by atomic layer deposition (ALD). The conductor forming the work function metal layer 30 may be selected as appropriate for the metal gate of either an n-type field-effect transistor or a p-type field-effect transistor. For example, the work function metal layer 30 may include a conformal layer composed of a conductor, such as titanium aluminum carbide (TiAlC) or titanium nitride (TiN), deposited by atomic layer deposition (ALD).

The gate dielectric layer 28 and work function metal layer 30 are chamfered and recessed within the trenches 26 with an etching process by a distance, d1. To that end, a removable etch mask 32 is applied in the gap within each trench 26 interior of the work function metal layer 30 prior to etching. The etch mask 32 may include an organic planarization layer (OPL) material that is applied by spin-coating and recessed with reactive ion etching (ME) to a thickness that provides the desired amount of chamfering for the gate dielectric layer 28 and work function metal layer 30. The recessed gate dielectric layer 28 and work function metal layer 30 of the gate structures 29 are located in a lower portion of the trenches 26.

Figure 3:
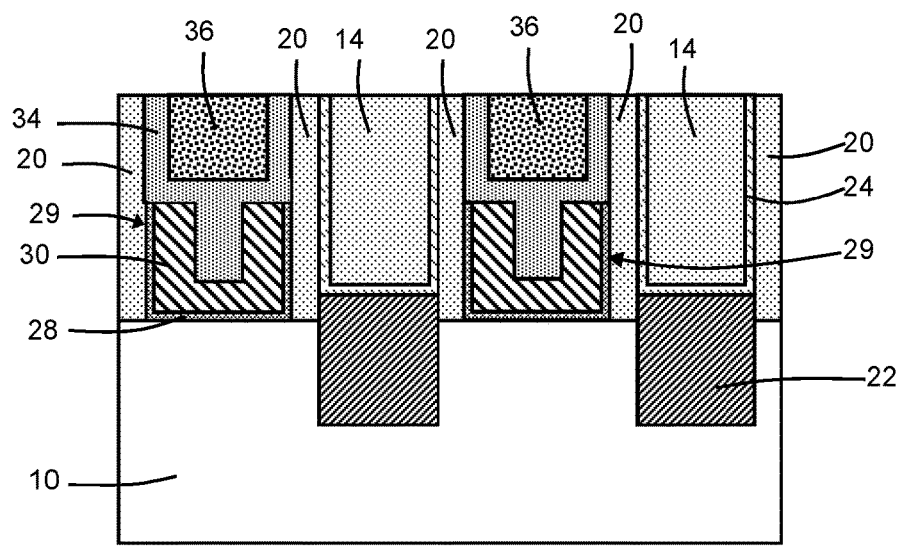

With reference to FIG. 3 in which like reference numerals refer to like features in FIG. 2 and at a subsequent fabrication stage of the processing method, the etch mask 32 is stripped, and a metal liner 34 is conformally deposited inside the upper portion of each trench 26. The metal liner 34 fills the gap interior of the work function metal layer 30 vacated by the stripping of the etch mask 32, coats the top surface of the gate dielectric layer 28 and work function metal layer 30, and coats the sidewall spacers 20 at the opposite side edges of the trenches 26. The metal liner 34 may be composed of a conductor, such as titanium nitride (TiN), deposited by atomic layer deposition (ALD). A metal fill layer 36 is then formed in the remaining unfilled part of the upper portion of each trench 26. The metal fill layer 36 may be composed of a conductor, such as tungsten (W), deposited non-conformally by chemical vapor deposition (CVD) and planarized along with the metal liner 34 by chemical mechanical polishing (CMP). The metal liner 34 operates as a barrier layer with respect to diffusion of atoms of the material of the metal fill layer 36 into surrounding structures, such as the sidewall spacers 20, the gate dielectric layer 28, and/or the work function metal layer 30. Each gate structure 29 further includes the metal liner 34 and metal fill layer 36 in addition to the gate dielectric layer 28 and work function metal layer 30.

Figure 4:
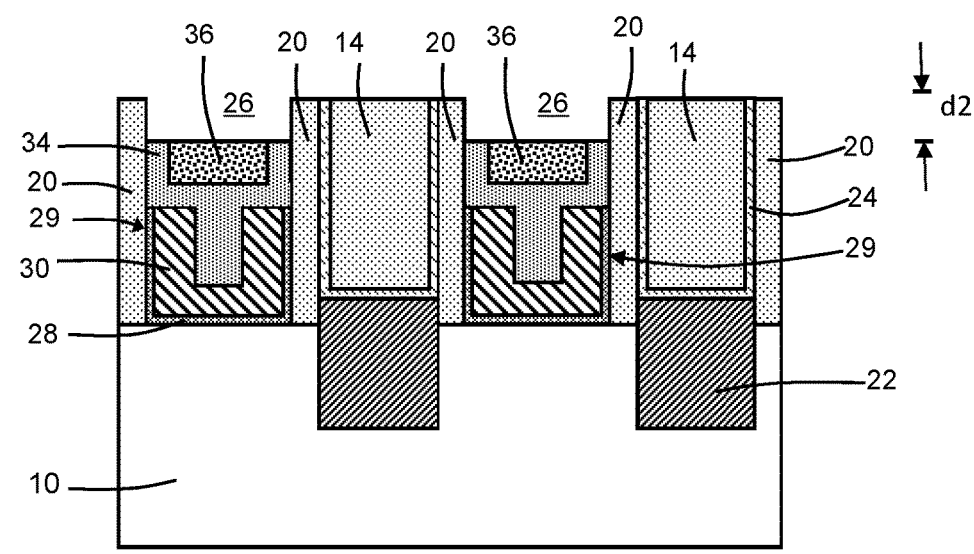

With reference to FIG. 4 in which like reference numerals refer to like features in FIG. 3 and at a subsequent fabrication stage of the processing method, the metal liner 34 and metal fill layer 36 are etched back and thereby recessed by a distance, d2, relative to the interlayer dielectric layer 14, the sidewall spacers 20, and CESL 24. The result is that the trenches 26 are partially re-opened over the recessed metal liner 34 and metal fill layer 36. To promote the recessing, the materials of the metal liner 34 and metal fill layer 36 may be selected to be removed selective to the materials of the interlayer dielectric layer 14, sidewall spacers 20, and CESL 24.

Figure 5:
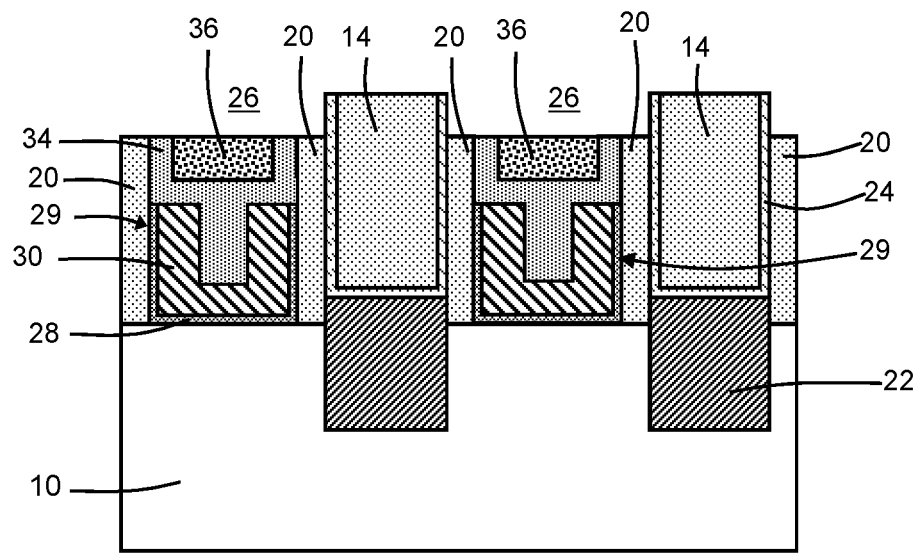

With reference to FIG. 5 in which like reference numerals refer to like features in FIG. 4 and at a subsequent fabrication stage of the processing method, the sidewall spacers 20 are etched back and thereby recessed relative to the interlayer dielectric layer 14 and CESL 24 after the metal liner 34 and metal fill layer 36 are recessed. The upper portion of each trench 26 over the recessed metal liner 34 and metal fill layer 36 is widened by the recessing of the sidewall spacers 20. The material of the sidewall spacers 20 may be selected to be removed selective to the materials of the interlayer dielectric layer 14, metal liner 34, and metal fill layer 36. The top surface of the recessed sidewall spacers 20 may be coplanar with the top surface of the recessed metal fill layer 36.

Figure 6:
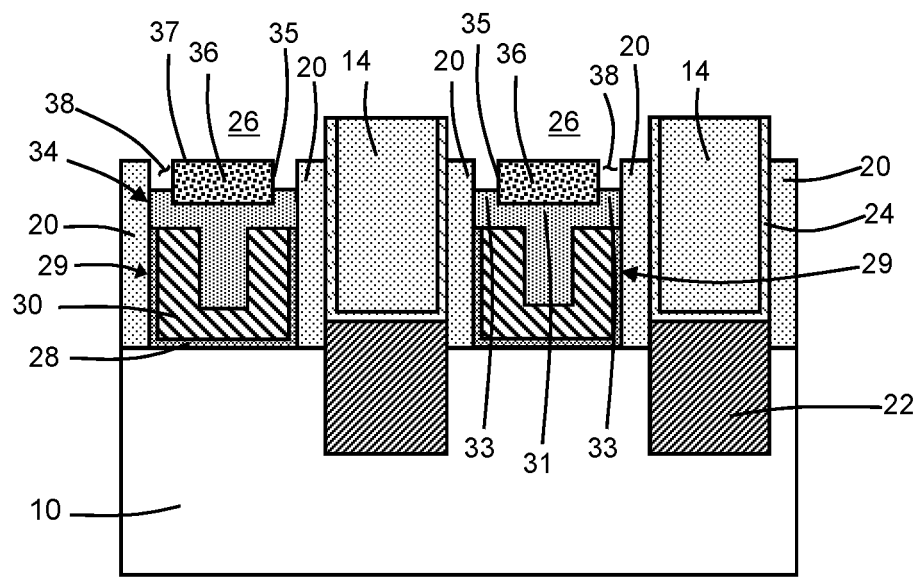

With reference to FIG. 6 in which like reference numerals refer to like features in FIG. 5 and at a subsequent fabrication stage of the processing method, the metal liner 34 is etched back and thereby recessed relative to a top surface 37 of the metal fill layer 36 after the sidewall spacers 20 are recessed. Cavities or gaps 38 are respectively defined between the recessed metal liner 34 and an upper portion of the sidewalls 35 of the metal fill layer 36. The material of the metal liner 34 may be selected to be removed selective to the material of the metal fill layer 36, as well as selective to the materials of the interlayer dielectric layer 14 and sidewall spacers 20.

The recessed metal liner 34 has a U-shape in which a horizontal section 31 is arranged over the gate dielectric layer 28 and work function metal layer 30, and other vertical sections 33 are respectively arranged between a lower portion of the sidewall 35 of the metal fill layer 36 and the sidewall spacers 20. The section 31 of the recessed metal liner 34 is arranged between the metal fill layer 36 and the work function metal layer 30. The sections 33 of the recessed metal liner 34 project at the opposite side edges of the section 31 of the recessed metal liner 34 in a vertical direction away from the section 31.

Figure 7:
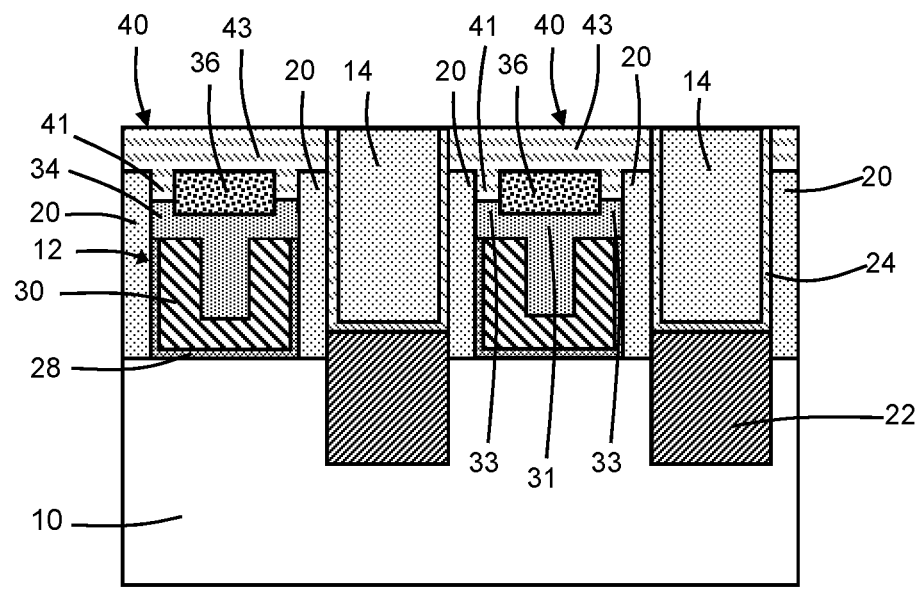

With reference to FIG. 7 in which like reference numerals refer to like features in FIG. 6 and at a subsequent fabrication stage of the processing method, self-aligned contact caps 40 are formed that fill the gaps 38 and the trenches 26. The self-aligned contact caps 40 may be may be composed of a dielectric material, such as silicon nitride ($Si_3N_4$). The self-aligned contact caps 40 have an inverted pi-shape in which a section 43 of each cap 40 is arranged in the trench 26 over the top surface 37 of the metal fill layer 36 and sections 41 of each cap 40 are respectively arranged in the gaps 38. The sections 41 of each self-aligned contact cap 40 are arranged adjacent to portions of the sidewalls 35 of the metal fill layer 36. The sections 41 of each self-aligned contact cap 40 project in the vertical direction away from the section 43 as legs extending into the gaps 38 so as to provide the inverted pi-shape. The orientation of the sections 41 is established at least in part by the recessing of the metal liner 34 relative to the metal fill layer 36 and the location of the sections 41 at the opposite side edges of the section 43 is established at least in part by the locations of the gaps 38 between the sidewalls 35 of the recessed metal fill layer 36 and the sidewall spacers 20. To provide the pi-shape, the sections 41 are displaced inward from the outer boundary of the section 43 by a distance equal to, or approximately equal to, the thickness of the sidewall spacers 20.

Figure 8:
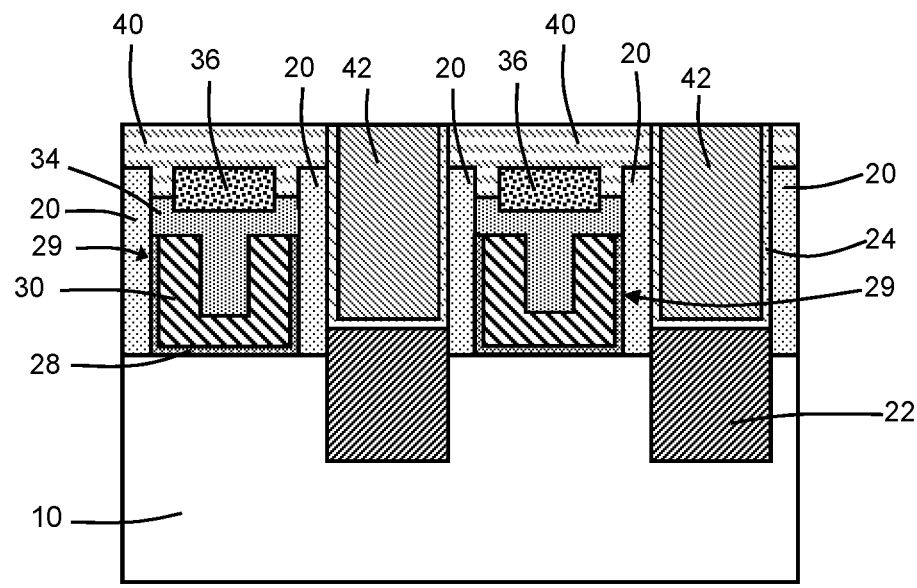

With reference to FIG. 8 in which like reference numerals refer to like features in FIG. 7 and at a subsequent fabrication stage of the processing method, the sections of the interlayer dielectric layer 14 are removed with an etching process in order to expose the source/drain regions 22. Trench silicide (TS) contacts 42 are formed in the spaces resulting from the removal of the sections of the interlayer dielectric layer 14. The TS contacts 42 extend vertically to directly connect with the source/drain regions 22. The TS contacts 42 may include a metal silicide, such as titanium silicide ($TiSi_2$), tungsten silicide ($WSi_2$), nickel silicide (NiSi), or cobalt silicide ($CoSi_2$), deposited by chemical vapor deposition (CVD), as well as an overlying conductor, such as tungsten (W), ruthenium (Ru), or cobalt (Co), that may also be deposited by chemical vapor deposition (CVD). The TS contacts 42 may be planarized by chemical mechanical polishing (CMP) to be coplanar with the self-aligned contact caps 40.

Figure 9:
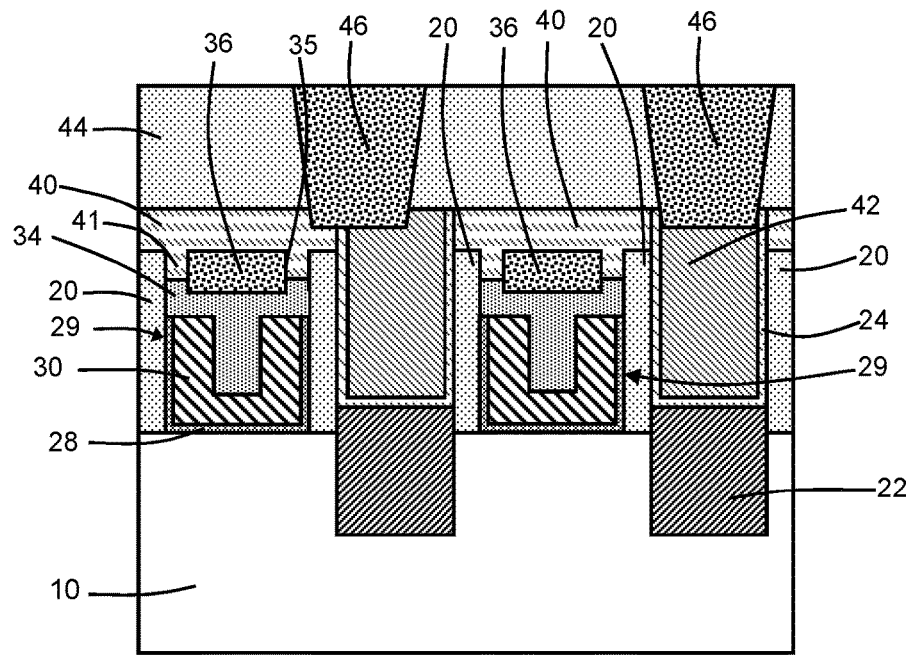

With reference to FIG. 9 in which like reference numerals refer to like features in FIG. 8 and at a subsequent fabrication stage of the processing method, an interlayer dielectric layer 44 may be deposited and planarized with, for example, chemical mechanical polishing (CMP). The interlayer dielectric layer 44 may be composed of a dielectric material, such as silicon dioxide ($SiO_2$). Contacts 46 are formed in contact openings defined in the interlayer dielectric layer 44 by lithography and etching. The contact openings may be clad by a conformal barrier layer that is deposited before the contacts 46 are formed. The contacts 46, which may be composed of tungsten (W), ruthenium (Ru), cobalt (Co), or copper (Cu), extend in a vertical direction through the interlayer dielectric layer 44 and are directly connected to the TS contacts 42.

A portion of the sidewall 35 of the metal fill layer 36 is arranged above the sections 33 of the metal liner 34 and adjacent to the sections 41 of each self-aligned contact cap 40. A portion of the sidewall 35 of the metal fill layer 36 is arranged below the sections 41 of each self-aligned contact cap 40 and adjacent to the sections 33 of the metal liner 34.

The sections 41 of the self-aligned contact caps 40 in the gaps 38 (FIG. 6) increase the effective thickness of dielectric material between the contacts 46 and the metal fill layer 36. The gaps 38 result at least in part from recessing the metal liner 34 relative to the metal fill layer 36. The increased dielectric material thickness operates to improve the misalignment margin for the contact 46 so that the misalignment of the contact opening is less likely to result in a short between the gate structure 29 and the contact 46.

Figure 10:
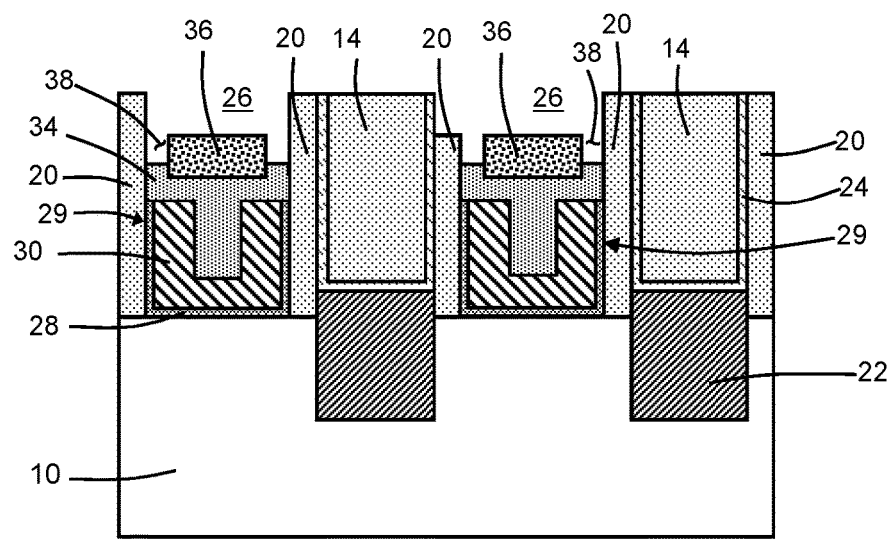
FIGS. 10-12 are cross-sectional views of a portion of a substrate at successive fabrication stages subsequent to FIG. 4 of a processing method for forming a structure in accordance with alternative embodiments of the invention.

With reference to FIG. 10 in which like reference numerals refer to like features in FIG. 4 and at a subsequent fabrication stage of a processing method in accordance with alternative embodiments, the metal liner 34 is etched back and thereby recessed relative to the metal fill layer 36 before the sidewall spacers 20 are etched back and recessed.

Figure 11:
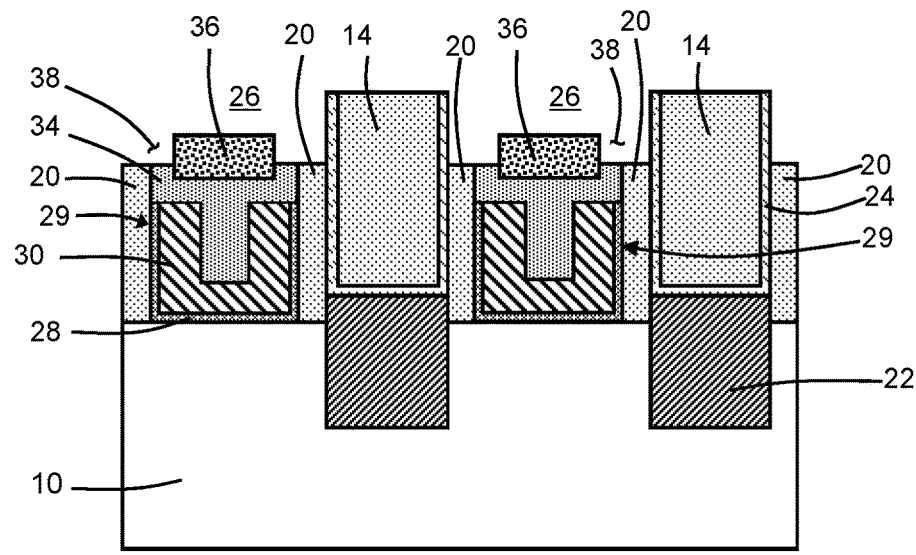

With reference to FIG. 11 in which like reference numerals refer to like features in FIG. 10 and at a subsequent fabrication stage of the processing method, the sidewall spacers 20 are etched back and recessed relative to the interlayer dielectric layer 14 and CESL 24 after the metal liner 34 is recessed relative to the metal fill layer 36. The sidewall spacers 20 may be recessed below the top surface of the metal fill layer 36 and to the level of the recessed metal liner 34, which increases the lateral dimension of the gaps 38 (i.e., widens the gaps 38). The top surface of the recessed sidewall spacers 20 may be coplanar with the top surface of the recessed metal liner 34. The lateral dimension (i.e., width) of each of the gaps 38 is increased by a distance equal to, or approximately equal to, the thickness of the recessed sidewall spacers 20.

Figure 12:
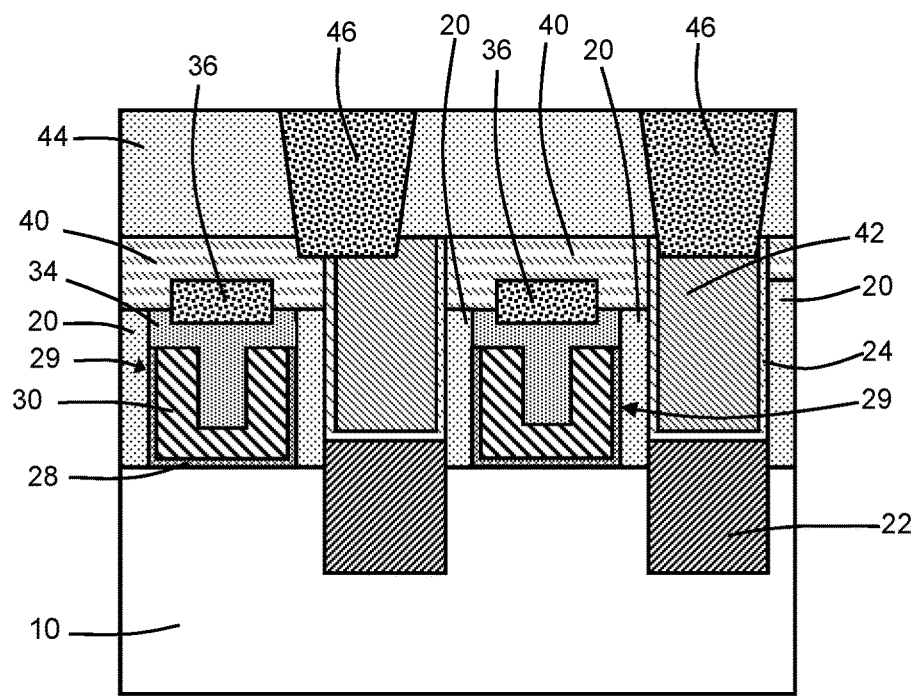

With reference to FIG. 12 in which like reference numerals refer to like features in FIG. 11 and at a subsequent fabrication stage of the processing method, processing continues as described in connection with FIGS. 7-9 to form the self-aligned contact caps 40, the TS contacts 42, and the contacts 46. The reduced height of the sidewall spacers 20 increases the width of the gaps 38, which consequently increases the effective thickness of dielectric material provided by the sections 41 of the self-aligned contact caps 40 filling the widened gaps 38 between the contacts 46 and the metal fill layer 36.

Figure 13:
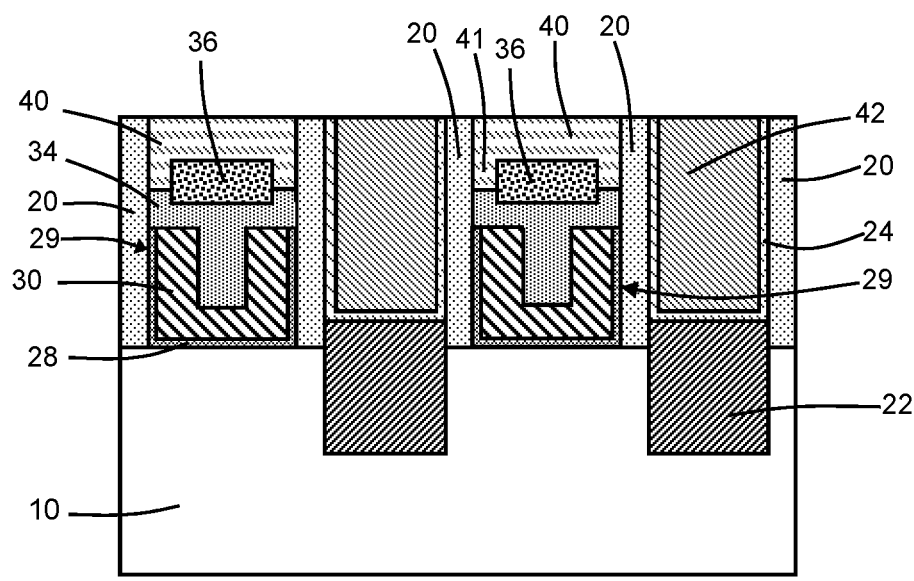
FIG. 13 is a cross-sectional view of a portion of a substrate at a fabrication stage subsequent to FIG. 10 of a processing method for forming a structure in accordance with alternative embodiments of the invention.

With reference to FIG. 13 in which like reference numerals refer to like features in FIG. 10 and at a subsequent fabrication stage of the processing method, the sidewall spacers 20 may not be etched back and recessed after the metal liner 34 is recessed relative to the metal fill layer 36. Instead, the sidewall spacers 20 may retain their original height before the self-aligned contact caps 40 are formed as described in connection with FIG. 7. The self-aligned contact caps 40 have a U-shape in which the legs provided by sections 41 are narrower in comparison with embodiments in which the sidewall spacers 20 are recessed. Processing continues as described in connection with FIGS. 8 and 9.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the "horizontal", as just defined. The term "lateral" refers to a direction within the horizontal plane. Terms such as "above" and "below" are used to indicate positioning of elements or structures relative to each other as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a semiconductor device, the structure comprising:
   a gate structure including a work function metal layer, a first conductor layer, and a second conductor layer arranged over the work function metal layer, the second conductor layer including a sidewall and a top surface, and the first conductor layer including a first section arranged between the second conductor layer and the work function metal layer and a second section arranged adjacent to a first portion of the sidewall; and
   a dielectric cap on the gate structure, the dielectric cap including a first section arranged over the top surface of the second conductor layer and a second section arranged adjacent to a second portion of the sidewall of the second conductor layer.

2. The structure of claim 1 further comprising:
   a sidewall spacer arranged adjacent to the gate structure,
   wherein the second section of the first conductor layer is laterally arranged between the first portion of the sidewall of the second conductor layer and the sidewall spacer, and the second section of the dielectric cap is laterally arranged between the second portion of the sidewall of the second conductor layer and the sidewall spacer.

3. The structure of claim 2 further comprising:
   a source/drain region; and
   a first contact arranged adjacent to the gate structure, the first contact directly connected with the source/drain region,
   wherein the sidewall spacer is laterally arranged between the second section of the first conductor layer and the first contact, and the sidewall spacer is laterally arranged between the second section of the dielectric cap and the first contact.

4. The structure of claim 3 further comprising:
   an interlayer dielectric layer arranged over the gate structure and the first contact; and
   a second contact in the interlayer dielectric layer, the second contact directly connected with the first contact,
   wherein the second contact is arranged over the gate structure, and the second section of the dielectric cap is arranged between the second contact and the second portion of the sidewall of the second conductor layer.

5. The structure of claim 1 further comprising:
   a sidewall spacer arranged adjacent to the gate structure,
   wherein the second section of the first conductor layer is laterally arranged between the first portion of the sidewall of the second conductor layer and the sidewall spacer.

6. The structure of claim 5 further comprising:
   a source/drain region; and
   a first contact arranged adjacent to the gate structure, the first contact directly connected with the source/drain region,
   wherein the sidewall spacer is laterally arranged between the second section of the first conductor layer and the first contact, and the second section of the dielectric cap is laterally arranged between the first contact and the second portion of the sidewall of the second conductor layer.

7. The structure of claim 6 further comprising:
   an interlayer dielectric layer over the gate structure and the first contact; and
   a second contact in the interlayer dielectric layer, the second contact having a direct connection with the first contact,
   wherein the second section of the dielectric cap is arranged between the second contact and the second portion of the sidewall of the second conductor layer.

8. The structure of claim 1 wherein the dielectric cap includes a third section connected with the second section by the first section to define a U-shape or a pi-shape.

9. The structure of claim 8 wherein the first conductor layer includes a third section connected with the second section by the first section to define a U-shape, and the U-shape or the pi-shape of the dielectric cap is inverted relative to the U-shape of the first conductor layer.

10. The structure of claim 9 wherein the second conductor layer is surrounded in part by the first conductor layer and in part by the dielectric cap.

11. A method comprising:
   forming a work function metal layer of a gate structure in a lower portion of a trench;
   conformally depositing a first conductor layer over the work function metal layer and on an upper portion of the trench;
   forming a second conductor layer that fills the upper portion of the trench interior of the first conductor layer;
   recessing the first conductor layer relative to the second conductor layer such that a section of the first conductor layer is arranged adjacent to a first portion of a sidewall of the second conductor layer and a second portion of the sidewall of the second conductor layer is exposed; and
   after recessing the first conductor layer relative to the second conductor layer, forming a dielectric cap that includes a first section over a top surface of the second conductor layer and a second section arranged adjacent to the second portion of the sidewall of the first conductor layer.

12. The method of claim 11 further comprising:
   before forming the work function metal layer, forming a first sidewall spacer and a second sidewall spacer between which the trench is located;
   before conformally depositing the first conductor layer, recessing the work function metal layer relative to the first sidewall spacer and the second sidewall spacer; and
   before recessing the first conductor layer relative to the second conductor layer, recessing the first conductor layer and the second conductor layer relative to the first sidewall spacer and the second sidewall spacer.

13. The method of claim 12 wherein a cavity is defined between the second portion of the sidewall of the second conductor layer and the first sidewall spacer when the first conductor layer and the second conductor layer are recessed relative to the first sidewall spacer and the second sidewall spacer, and the second section of the dielectric cap fills the cavity.

14. The method of claim 12 further comprising:
   after recessing the first conductor layer relative to the second conductor layer, recessing the first sidewall spacer and the second sidewall spacer relative to the first conductor layer and the second conductor layer.

15. The method of claim 14 further comprising:
   forming a source/drain region; and
   forming a first contact arranged adjacent to the gate structure, the first contact directly connected with the source/drain region,
   wherein the first sidewall spacer is laterally arranged between the second section of the first conductor layer and the first contact, and the first sidewall spacer is laterally arranged between the second section of the dielectric cap and the first contact.

16. The method of claim 15 further comprising:
   forming an interlayer dielectric layer over the gate structure and the first contact; and
   forming a second contact in the interlayer dielectric layer that is directly connected with the first contact,
   wherein the second contact is arranged over the gate structure, and the second section of the dielectric cap is arranged between the second contact and the second portion of the sidewall of the second conductor layer.

17. The method of claim 12 further comprising:
   before recessing the first conductor layer relative to the second conductor layer, recessing the first sidewall spacer and the second sidewall spacer relative to the first conductor layer and the second conductor layer.

18. The method of claim 17 further comprising:
   forming a source/drain region; and
   forming a first contact arranged adjacent to the gate structure and directly connected with the source/drain region,
   wherein the first sidewall spacer is laterally arranged between the second section of the first conductor layer and the first contact, and the second section of the dielectric cap is laterally arranged between the first contact and the second portion of the sidewall of the second conductor layer.

19. The method of claim 18 further comprising:
   forming an interlayer dielectric layer over the gate structure and the first contact; and
   forming a second contact in the interlayer dielectric layer, the second contact having a direct connection with the first contact,
   wherein the second section of the dielectric cap is arranged between the second contact and the second portion of the sidewall of the second conductor layer.

20. The method of claim 12 wherein a cavity is defined between the second portion of the sidewall of the second conductor layer and the first sidewall spacer when the first conductor layer and the second conductor layer are recessed relative to the first sidewall spacer and the second sidewall spacer, the second section of the dielectric cap fills the cavity, and the first section of the dielectric cap fills the upper portion of the trench between the first sidewall spacer and the second sidewall spacer.

* * * * *